(12) United States Patent
Lin (10) Patent No.: US 7,693,002 B2
(45) Date of Patent: Apr. 6, 2010

(54) DYNAMIC WORD LINE DRIVERS AND DECODERS FOR MEMORY ARRAYS

(75) Inventor: Jentsung Lin, Cardiff by the Sea, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/548,132

(22) Filed: Oct. 10, 2006

(65) Prior Publication Data
US 2008/0084778 A1    Apr. 10, 2008

(51) Int. Cl.
*G11C 11/00*   (2006.01)
(52) U.S. Cl. ............................ 365/230.06; 365/233.5
(58) Field of Classification Search ............ 365/230.06, 365/233
See application file for complete search history.

(56) References Cited

U.S. PATENT DOCUMENTS

| 5,051,959 | A | * | 9/1991 | Nakano et al. ......... 365/230.06 |
| 5,596,539 | A | * | 1/1997 | Passow et al. ............... 365/210 |
| 5,602,796 | A | * | 2/1997 | Sugio .................... 365/230.06 |
| 5,826,056 | A | * | 10/1998 | Noda ......................... 711/167 |
| 6,856,574 | B2 | * | 2/2005 | Iwahashi et al. ............ 365/233 |
| 7,047,385 | B1 | * | 5/2006 | Bhattacharya et al. ...... 711/169 |
| 7,092,305 | B2 | | 8/2006 | Watanabe et al. |
| 2001/0015926 | A1 | * | 8/2001 | Kato et al. .................. 365/201 |
| 2003/0046632 | A1 | * | 3/2003 | Hatakenaka et al. ........ 714/763 |
| 2004/0190352 | A1 | * | 9/2004 | Watanabe et al. ........... 365/191 |
| 2004/0246806 | A1 | | 12/2004 | Ha |
| 2005/0052904 | A1 | | 3/2005 | Cho |

OTHER PUBLICATIONS

International Search Report - PCT/US07/080993 - International Search Authority - European Patent Office - May 14, 2008.
Written Opinion - PCT/US07/080993 - International Search Authority - European Patent Office - May 14, 2008.

* cited by examiner

*Primary Examiner*—Michael T Tran
(74) *Attorney, Agent, or Firm*—Nicholas J. Pauley; Peter Kamarchik; Sam Talpalatsky (57) ABSTRACT

In a particular illustrative embodiment, a circuit device that includes first logic and second logic is disclosed. The first logic receives a clock signal and a first portion of a memory address of a memory array, decodes the first portion of the memory address, and selectively applies the clock signal to a selected group of wordline drivers associated with the memory array. The second logic decodes a second portion of the memory address and selectively activates a particular wordline driver of the selected group of wordline drivers according to the second portion of the memory address.

38 Claims, 5 Drawing Sheets

DYNAMIC WORD LINE DRIVERS AND DECODERS FOR MEMORY ARRAYS

BACKGROUND

I. Field

The present disclosure generally relates to memory arrays, and more particularly, to dynamic wordline drivers and decoders for memory arrays.

II. Description of Related Art

In general, memory systems with a traditional dynamic/static circuit structure may place a heavy load on the clock. For example, in a memory structure having a plurality of wordline drivers, a single clock may drive multiple drivers and multiple address decoders, placing a large electrical load on the clock.

Additionally, each wordline driver may have its own decoded address input, which may place a large load on the decoder and which may utilize a large area of the circuit substrate, increasing complexity and power consumption. Moreover, when the clock signal is provided to multiple wordline drivers, capacitive noise coupling between the wordline driver outputs may introduce additional design complexities. Hence, there is a need for improved wordline drivers.

SUMMARY

In a particular illustrative embodiment, a circuit device that includes first logic and second logic is disclosed. The first logic receives a clock signal and a first portion of a memory address of a memory array, decodes the first portion of the memory address, and selectively applies the clock signal to a selected group of wordline drivers associated with the memory array. The second logic decodes a second portion of the memory address and selectively activates a particular wordline driver of the selected group of wordline drivers according to the second portion of the memory address.

In another particular embodiment, a method of selecting a particular wordline of a memory array is disclosed. The method includes selectively providing a clock signal to a selected group of wordline drivers of a plurality of wordline drivers based on a first portion of a memory address of the memory array. Each wordline driver is associated with a wordline of the memory array. The method further includes activating a particular wordline driver of the selected group of wordline drivers according to a second portion of the memory address.

In another particular embodiment, an integrated circuit includes a substrate and a plurality of circuit devices. The circuit devices are arranged on the substrate to reduce capacitive coupling noise. The plurality of circuit devices includes a first wordline driver having a first pair of transistors and a first wordline output and includes a second wordline driver having a second pair of transistors and a second wordline output. The first and second wordline drivers are disposed on the substrate in a single row. A first wire trace couples the first pair of transistors to the first wordline output. The second wire trace couples the second pair of transistors to the second wordline output. The first wire trace and the second wire trace are substantially parallel. An advantage of this embodiment is that the layout provides increased capacitive noise-coupling immunity.

One particular advantage of a particular illustrative embodiment of the circuit device is that a timing delay from a clock to a particular wordline is reduced. Still another particular advantage of a particular illustrative embodiment of the circuit device is that the clock driver's capacitance loading may also be reduced. Another particular advantage of a particular illustrative embodiment is that use of multiple conditional clocks to selectively apply a clock signal reduces power consumption. In a particular embodiment, the clock power consumption may be reduced to one-fourth of the power consumed by a single clock system (e.g. the power consumption of a clock generator may be reduced by 75%). This reduction in power consumption provides an additional advantage in that power is conserved for use in other processes and/or to extend an operational life of a power source, such as a battery.

Still another particular advantage of a particular illustrative embodiment may be realized by sharing a common address signal among multiple wordline decoders, which reduces power consumption and conserves layout area. In a particular embodiment, four wordline drivers may share a common address signal, which reduces transistor gate loading of the decoders without decreasing speed.

Other aspects, advantages, and features of the present disclosure will become apparent after review of the entire application, including the following sections: Brief Description of the Drawings, Detailed Description, and the Claims.

BRIEF DESCRIPTION OF THE DRAWINGS

The aspects and the attendant advantages of the embodiments described herein will become more readily apparent by reference to the following detailed description when taken in conjunction with the accompanying drawings wherein.

DETAILED DESCRIPTION

Figure 1:
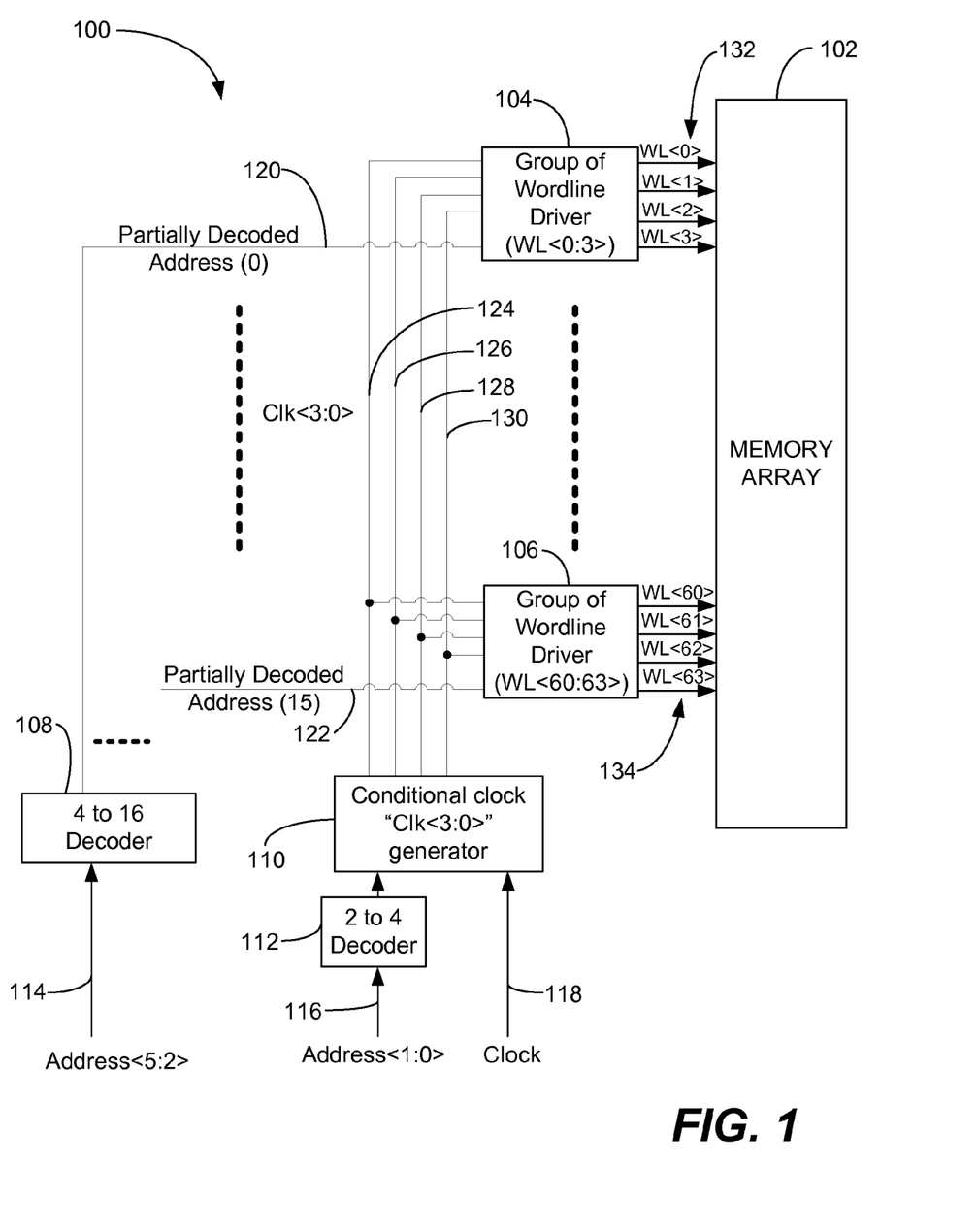
FIG. 1 is a block diagram of a particular illustrative embodiment of a wordline driver system including a plurality of groups of wordline drivers associated with a memory array.

FIG. 1 is a block diagram of a particular illustrative embodiment of a wordline driver system 100 including a set of wordline drivers, such as the groups of wordline drivers 104 and 106 that are associated with a memory array 102. The system 100 may include multiple additional sets of wordline drivers (not shown). Each set of wordline drivers may control up to sixty-four wordlines (numbered zero to sixty-three) using sixty-four corresponding wordline drivers. The set of sixty-four wordlines and corresponding wordline drivers may be divided into groups of wordline drivers, such as the groups of wordline drivers 104 and 106. In a particular embodiment, the group of wordline drivers 104 may drive wordlines, such as the wordlines 132 from zero to three (WL<0>, WL<1>, WL<2>, and WL<3>), and the group of wordline drivers 106 may control wordlines, such as the wordlines 134 from sixty to sixty-three (WL<60>, WL<61>, WL<62>, and WL<63>). In this instance, each of the groups of wordline drivers 104 and 106 control four wordlines, and the set of wordline drivers may include sixteen groups. For clarity, only the two illustrative groups of wordline drivers 104 and 106 are shown and other groups associated with wordlines of the memory array 102 (such as wordline drivers that control the wordlines from four through fifty-nine) are omitted.

The system 100 may also include a four-to-sixteen bit memory address decoder 108, a conditional clock generator 110, a two-to-four bit memory address decoder 112, address inputs 114 and 116, and a clock input 118. The system 100 may also include partially decoded address lines 120 and 122, conditional clock outputs 124, 126, 128 and 130, and a group of wordline driver outputs 132 and 134. The conditional clock outputs 124, 126, 128, and 130 are also inputs to the groups of wordline drivers 104 and 106.

In a particular embodiment, a six-bit memory address specifying one of sixty-four wordlines in the memory array 102 is received. The two-to-four bit memory address decoder 112 may decode a first portion of the six-bit memory address (such as bits zero and one) via the address input 116, and the four-to-sixteen bit memory address decoder 108 may decode the remainder (i.e. a second portion) of the six-bit memory address (such as bits two to five) via the address input 114. The two-to-four bit decoder 112 may decode the first portion of the memory address and may provide the decoded portion to the conditional clock generator 110. The conditional clock generator 110 receives a clock signal via the clock input 118 and selectively applies the clock signal to a selected one of the clock outputs 124, 126, 128 and 130. In general, each clock output 124, 126, 128 and 130 is coupled to each of the groups of wordline drivers 104 and 106 of the particular group of wordline drivers. In a particular embodiment, the conditional clock generator 110 may derive the clock outputs 124, 126, 128 and 130 from a single clock.

The four-to-sixteen bit memory address decoder 108 decodes the remainder of the six-bit memory address (e.g. bits two to five) and applies a partial address input to the wordlines that are related to the decoded memory address. For example, the decoded four bits of the partially decoded address may be applied to the partially decoded address line (0) 120 to enable the group of wordline drivers 104 to enable one of the four wordlines (WL<0:3>) 132 to access data stored in the memory array 102.

In general, each group of wordline drivers, such as the group of wordline drivers 104 may share a common partially decoded address input, such as the partially decoded address line (0) 120 for the group of wordline drivers 104, reducing layout area usage and layout complexity. Additionally, the common address input reduces input gate capacitance loading without introducing timing delays. In general, the clock outputs 124, 126, 128, and 130 determine whether a device is in a dynamic evaluation state (e.g., an active evaluation state where a clock signal is applied) or in a static precharge state (e.g., a fixed voltage level, such a voltage high signal, is applied). Since only one of the four clock outputs 124, 126, 128 and 130 may be active at a time, only one of the four wordline drivers of the group of wordline drivers 104 is in the dynamic evaluation state (e.g. a clock signal is present), while the other three remain in a static precharge state (such as a logic high state). If the four-to-sixteen memory address decoder 108 decodes a portion (e.g. bits two to five) of the memory address to determine a set of wordlines from zero to three (WL<0>, WL<1>, WL<2> and WL<3> in FIG. 1), the four-to-sixteen bit memory address decoder 108 applies a signal to the address line 120. The dynamic evaluation state of a clock output, such as the clock 124, activates a particular wordline of the group of wordline drivers 104, such as wordline zero (WL<0>) of the memory array 102. In general, the decoded output of the two-to-four decoder 112 with clock generator 110 and the decoded output of the four-to-sixteen bit memory address decoder 108 may be utilized via a logical AND operation to selectively activate a wordline driver of the group of wordline drivers 104, for example.

Figure 2:
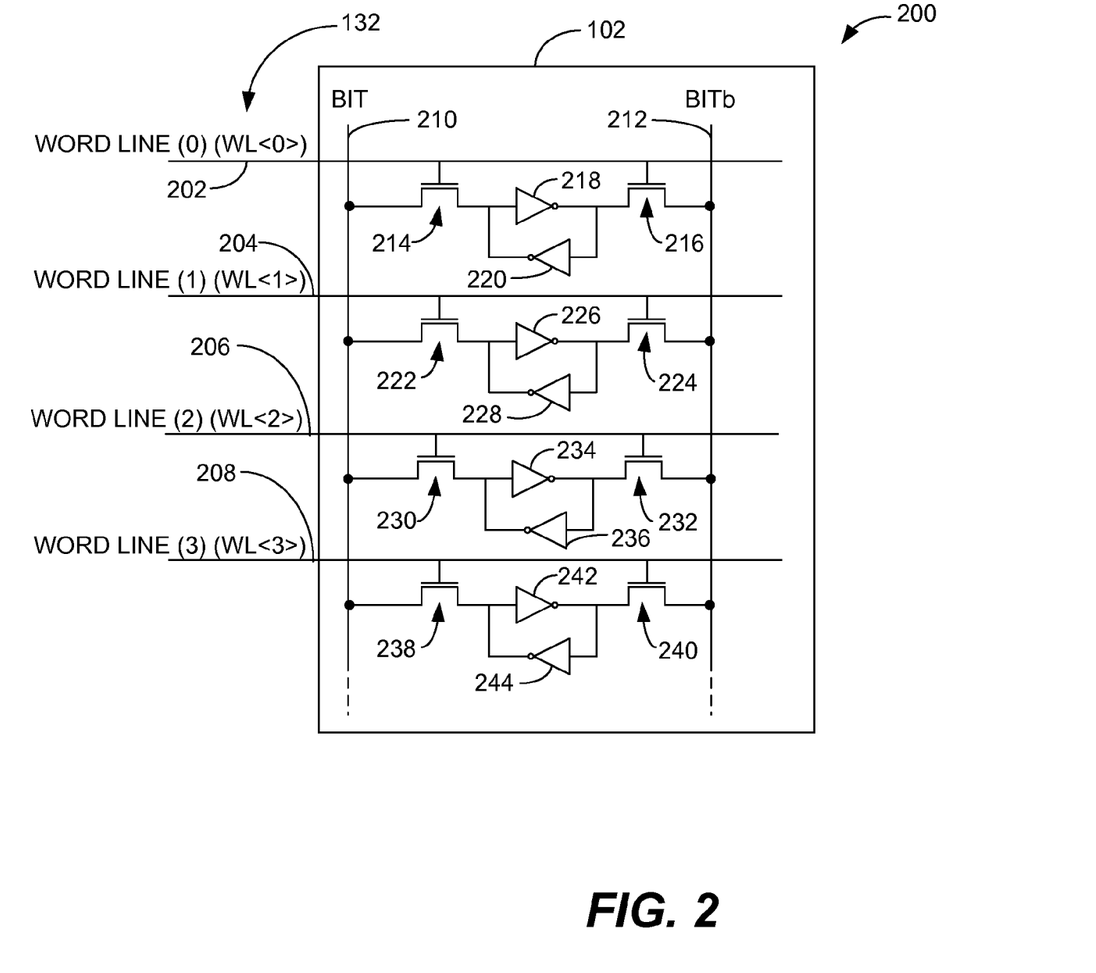
FIG. 2 is a circuit diagram of a particular illustrative embodiment of a portion of a memory array, such as the memory array of FIG. 1.

FIG. 2 is a circuit diagram of a particular illustrative embodiment of a portion 200 of a memory array, such as a portion of the memory array 102 of FIG. 1. The portion 200 of the memory array 102 includes wordlines 202, 204, 206, and 208 and bit lines 210 and 212. The portion 200 of the memory array 102 further includes transistors 214 and 216 and cross-coupled inverters 218 and 220 associated with the wordline 202. Additionally, the portion 200 of the memory array 102 may include transistors 222 and 224 and cross-coupled inverters 226 and 228 associated with the wordline 204. The portion 200 of the memory array 102 may further include transistors 230 and 232 and cross-coupled inverters 234 and 236 associated with the wordline 206. The portion 200 of the memory array 102 also includes transistors 238 and 240 and cross-coupled inverters 242 and 244 associated with the wordline 208. In a particular embodiment, the wordlines 202, 204, 206 and 208 may correspond to the wordlines 132 of the group wordline drivers 104 of FIG. 1.

In operation, when a particular wordline, such as the wordline 202 is charged, the other wordlines 204, 206 and 208 are held at a logic low level. The charged wordline 202 activates the transistors 214 and 216, which apply a differential voltage to the bit lines 210 and 212. The differential voltage is related to a bit stored by the cross-coupled inverters 242 and 244, which operates as a data latch to store a bit value. A sense amplifier or a differential amplifier (not shown) may be coupled to the bit lines 210 and 212 to detect a differential voltage and to output a value related to a value of the stored bit associated with the wordline 202.

Figure 3:
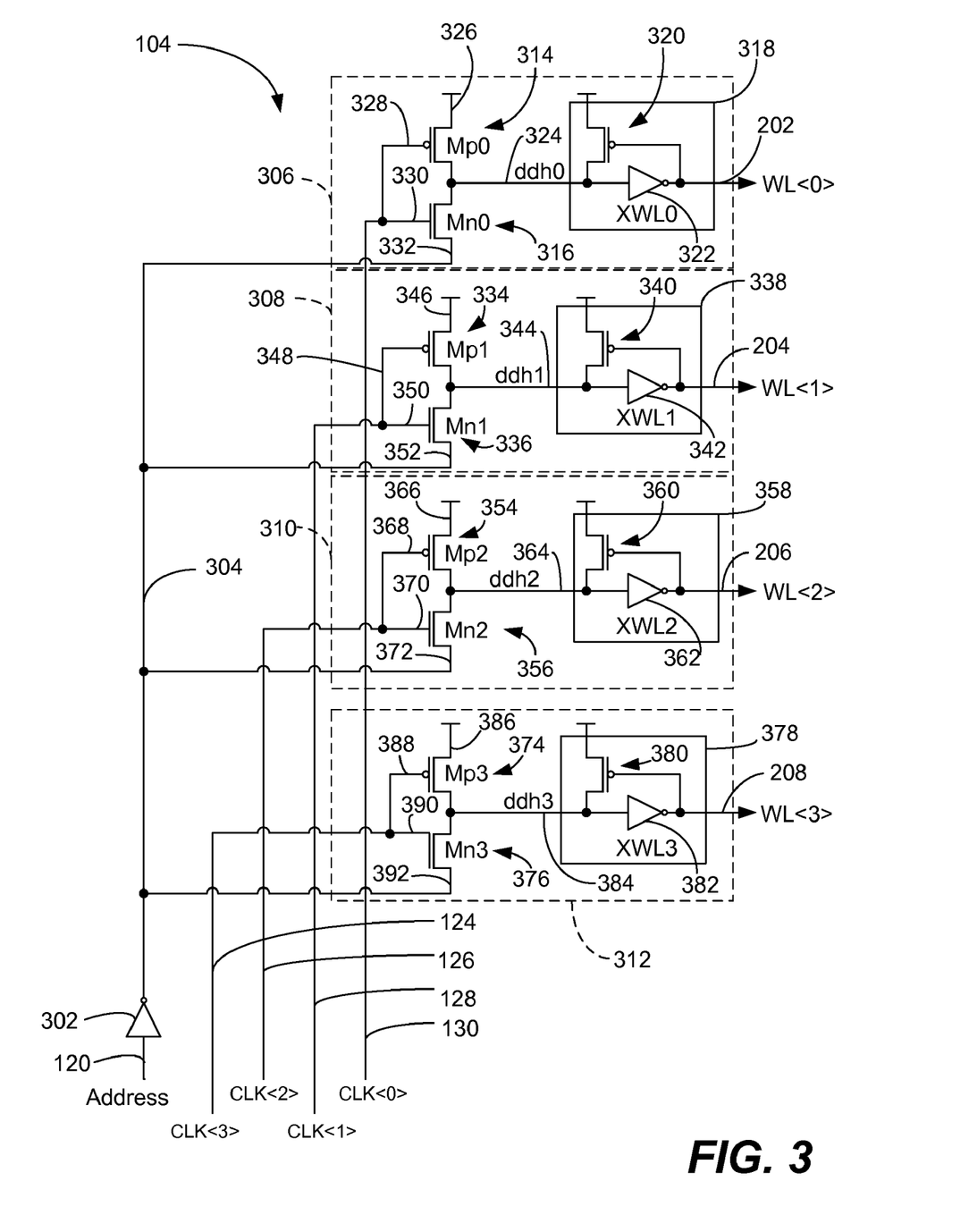
FIG. 3 is a circuit diagram of a particular illustrative embodiment of a group of wordline drivers, such as a selected group of wordline drivers of the plurality of groups of wordline drivers in FIG. 1.

FIG. 3 is a circuit diagram of a particular illustrative embodiment of a group of wordline drivers, such as the group of wordline drivers 104 in FIG. 1. The group of wordline drivers 104 includes an address input 120, clock outputs 124, 126, 128 and 130, an inverter 302, a shared address line 304, and wordline drivers 306, 308, 310 and 312.

The wordline driver 306 includes a first transistor (Mp0) 314, a second transistor (Mn0) 316, and an output driver 318, including a transistor 320 and an inverter (XWL0) 322 that are coupled to the first and second transistors 314 and 316 via a data line (ddh0) 324. The transistor 320 holds the data from device leakage. The inverter 322 is also coupled to the wordline (WL<0>) 202. The first transistor 314 includes a first terminal 326 coupled to a power terminal, a control terminal 328 coupled to the clock 130, and a second terminal coupled to the data line (ddh0) 324. The second transistor 316 includes a first terminal coupled to the data line (ddh0) 324, a control terminal 330 coupled to the clock 130, and a second terminal 332 coupled to the shared address line 304.

The wordline driver 308 includes a first transistor (Mp1) 334, a second transistor (Mn1) 336, and an output driver 338, including a transistor 340 to hold the data from device leakage and including an inverter (XWL1) 342 that are coupled to the first and second transistors 334 and 336 via a data line (ddh1) 344. The inverter 342 is also coupled to the wordline (WL<1>) 204. The first transistor 334 includes a first terminal 346 coupled to a power terminal, a control terminal 348 coupled to the clock 128, and a second terminal coupled to the data line (ddh1) 344. The second transistor 336 includes a first terminal coupled to the data line (ddh1) 344, a control terminal 350 coupled to the clock 128, and a second terminal 352 coupled to the shared address line 304.

The wordline driver 310 includes a first transistor (Mp2) 354, a second transistor (Mn2) 356, and an output driver 358, including a transistor 360 to hold the data from device leakage and including an inverter (XWL2) 362 that are coupled to the first and second transistors 354 and 356 via a data line (ddh2) 364. The inverter 362 is also coupled to the wordline (WL<2>) 206. The first transistor 354 includes a first terminal 366 coupled to a power terminal, a control terminal 368 coupled to the clock 126, and a second terminal coupled to the data line (ddh2) 364. The second transistor 356 includes a first terminal coupled to the data line 364, a control terminal 370 coupled to the clock 126, and a second terminal 372 coupled to the shared address line 304.

The wordline driver 312 includes a first transistor (Mp3) 374, a second transistor (Mn3) 376, and an output driver 378, including a transistor 380 to hold the data from device leakage and including an inverter (XWL3) 382 that are coupled to the first and second transistors 374 and 376 via a data line (ddh3) 384. The inverter 382 is also coupled to the wordline (WL<3>) 208. The first transistor 374 includes a first terminal 386 coupled to a power terminal, a control terminal 388 coupled to the clock 124, and a second terminal coupled to the data line (ddh3) 384. The second transistor 376 includes a first terminal coupled to the data line 384, a control terminal 390 coupled to the clock 124, and a second terminal 392 coupled to the shared address line 304.

In a particular embodiment, an address is received via the address input 120 and inverted by the inverter 302 to provide a shared address input 304. As previously disclosed, a conditional clock generator, such as the conditional clock generator 110 of FIG. 1, applies a clock signal to a selected clock output, such as the clock output 130. The clock signal applied to the clock output 130 selectively activates the wordline driver 306 to access data of a memory array (such as the memory array 102 in FIG. 1) via the selected wordline 202. By applying the clock signal only to the selected clock output 130, power consumption is reduced, since the clock only drives a single line of a group of wordline drivers, as opposed to driving all of the wordline drivers. In a particular embodiment, since only one of the four clock outputs 124, 126, 128 and 130 is active at any given time, the power consumed by the clock may be reduced by 75% over a single clock system.

By sharing a common address 304 among multiple wordline drivers (decoders) 306, 308, 310, and 312, power consumption of the overall wordline driver circuitry may be reduced. Additionally, the layout area of the wordline drivers and layout complexity of the circuit design may be reduced. Further, the shared address input reduces transistor gate loading (e.g. control terminals 328, 330, 348, 350, 368, 370, 388, and 390) of the wordline drivers (decoders) 306, 308, 310 and 312 without decreasing the performance of the circuit.

In a particular illustrative embodiment, a conditional clock generator, such as the conditional clock generator 110 in FIG. 1, applies the clock signal to a selected clock output, such as the clock output 126. The other clocks 124, 128 and 130 may be held at a ground voltage level. The transistors 314, 334, and 374 are p-channel transistors, which are activated by a logic low signal. Thus, when the clocks 124, 128 and 130 are at a logic low level, the p-channel transistors 314, 334 and 374 are active, and the data lines 324, 344 and 384 are at a logic high level, placing a logic low voltage on the wordlines 202, 204 and 208, due to the inverters 322, 362 and 382.

The clock 126 deactivates the p-channel transistor (Mp2) 354 and activates the n-channel transistor (Mn2) 356. The address 120 is inverted by the inverter 302 and applied to the address line 304, which is coupled to the source of the n-channel transistor 356. The inverted address appears on the data line (ddh2) 364 and is inverted again by the inverter (XWL2) 362, coupling the address 120 to the wordline (WL<2>) 206. The clock 126 activates the desired wordline 206, while causing the other wordlines 202, 204 and 208 to be held at a logic low level. Thus, only the desired wordline 206 is active at any given time. The conditional clock generator, such as the conditional clock generator 110 in FIG. 1, applies the clock signal to only one of the four clocks 124, 126, 128 and 130, reducing power consumption by 75%.

In general, other conditional clock generator implementations may be used. For example, in a particular embodiment, a three-bit portion of the address 120 may be decoded and may be applied by the conditional clock generator to selectively apply a clock signal to one of eight lines, reducing power consumption by approximately 87.5%. Thus, the particular arrangement may allow for further reductions in power consumption.

Figure 4:
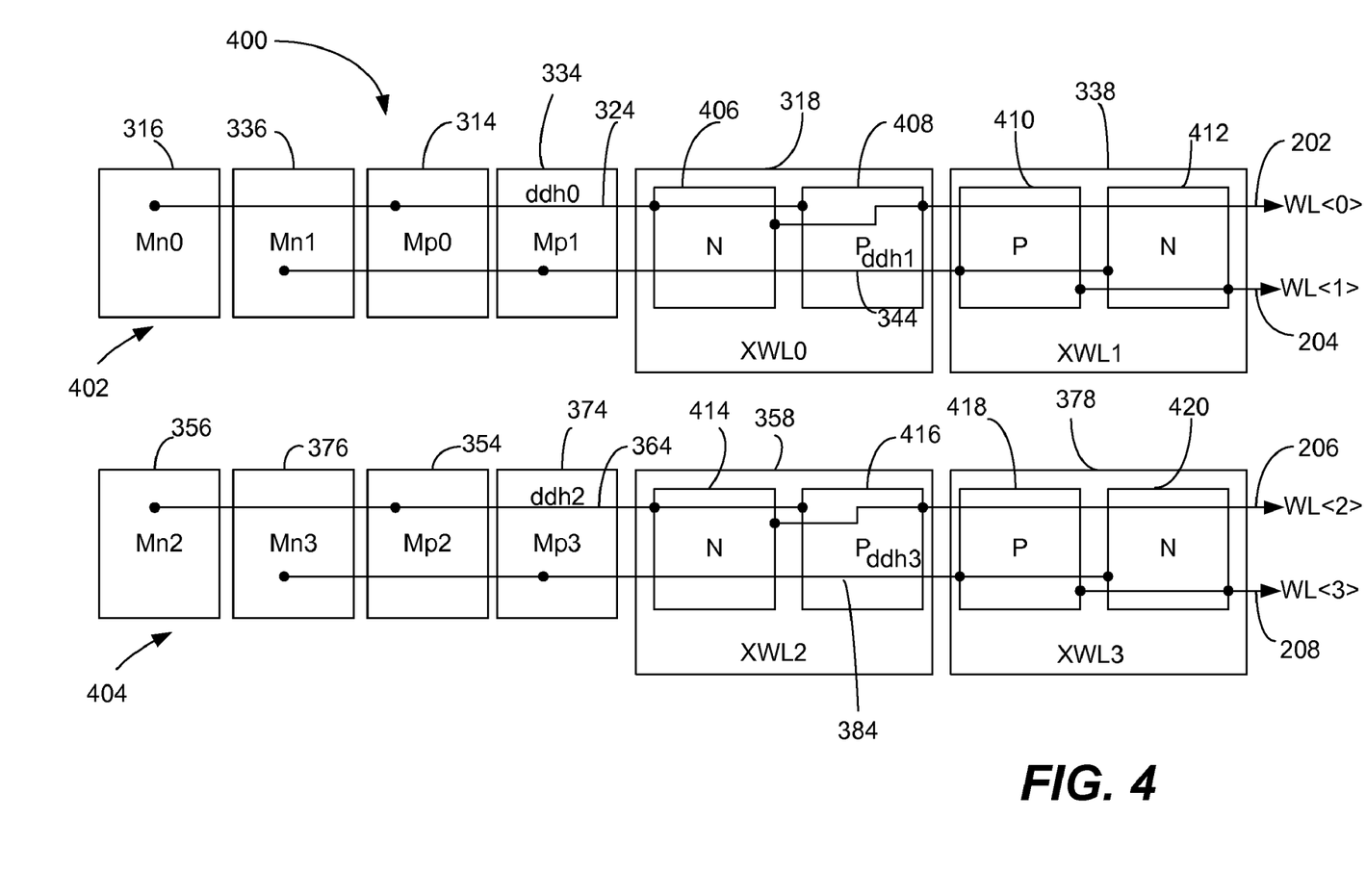
FIG. 4 is a block diagram of a particular illustrative embodiment of a layout on a circuit substrate including a group of wordline drivers, such as the group of wordline drivers of FIG. 3.

FIG. 4 is a block diagram of a particular illustrative embodiment of a circuit layout 400 of a circuit substrate including a group of wordline drivers, such as wordline drivers 306, 308, 310 and 312 of FIG. 3. In general, the elements of the wordline drivers 306, 308, 310 and 312 are depicted as rectangular regions on the substrate. It should be understood that transistors and other circuit components may be formed within such regions and may be sized to match the memory cell's height, such as a height between wordlines 202 and 208 in FIG. 2. For the purpose of the discussion, the regions are identified by the particular circuit components of FIG. 3 that may be formed within the particular region.

The circuit layout 400 includes the first transistor (Mp0) 314, the second transistor (Mn0) 316, and the output driver (XWL0) 318 of the wordline driver 306 in FIG. 3. The circuit layout 400 also includes the first transistor (Mp1) 334, the second transistor (Mn1) 336, and the output driver (XWL1) 338 of the wordline driver 308 in FIG. 3. The circuit layout 400 may also include the first transistor (Mp2) 354, the second transistor (Mn2) 356, and the output driver (XWL2) 358 of the wordline driver 310 in FIG. 3. Additionally, the circuit layout 400 may include the first transistor (Mp3) 374, the second transistor (Mn3) 376, and the output driver (XWL3) 378 of the wordline driver 312 in FIG. 3.

In general, a first row 402 includes the transistor (Mn0) 316, the transistor (Mn1) 336, the transistor (Mp0) 314, the transistor (Mp1) 334, the output driver (XWL0) 318, and the output driver (XWL1) 338. A second row 404 includes the transistor (Mn2) 356, the transistor (Mn3) 376, the transistor (Mp2) 354, the transistor (Mp3) 374, the output driver (XWL2) 358, and the output driver (XWL3) 378. The first row 402 and the second row 404 are substantially parallel.

Additionally, the line (ddh0) 324, the line (ddh1) 344, the line (ddh2) 364 and the line (ddh3) 384 are substantially parallel to one another. The output driver (XWL0) 318 may include a first region (N) 406 and a second region (P) 408. The output driver (XWL1) 338 may include a first region (P) 410 and a second region (N) 412. The output driver (XWL2) 358 may include a first region (N) 414 and a second region (P) 416. The output driver (XWL3) 378 may include a first region (P) 418 and a second region (N) 420. In general, the regions 408, 410, 416 and 418 may be utilized to form a transistor, such as the pull up transistors 320, 340, 360, and 380 in FIG. 3. The regions 406, 412, 414, and 420 may cooperate with the regions 408, 410, 416 and 418 to form the inverters 322, 342, 362, and 382 of FIG. 3.

By arranging the layout 400 of the wordline drivers 306, 308, 310 and 312 on the substrate as shown, capacitive noise-coupling immunity of the structure is improved. In particular, if the same clock signal is applied to each of the wordline drivers, any of the wire traces 324, 344, 364, and 384 and the corresponding circuit devices may be active. In such an instance, there may be undesired cross-coupling between the wire traces, such that a signal applied to one trace may experience inductive function error and power loss caused by capacitive coupling between the wire traces. However, a conditional clock, such as the conditional clock 110 in FIG. 1, activates only one wire trace and one corresponding set of structures at any given time. The exclusive nature of the application of a signal to the traces ensures that only one of the four wordline drivers 306, 308, 310 and 312 are in a dynamic evaluation state at any given time, and that the other wordline drivers are in a static "precharge" state. The particular arrangement places data line (ddh0) 314 and the wordline output 202 adjacent to the data line (ddh1) 334. The data line (ddh0) 314 and its associated wordline output 202 are inverted with respect to each other. Thus, a voltage applied to the data line (ddh0) 314 is inverted at the wordline 202. While the data line (ddh1) 334 might ordinarily experience capacitive coupling with the data line (ddh0) 314, resulting in data errors and power loss, the opposite voltages of the data line (ddh0) 314 and the associated wordline 202 apply opposing capacitive influences on the adjacent data line (ddh1) 334, canceling capacitive noise coupling between the data lines (ddh0 and ddh1) 314 and 334, for example. The particular arrangement generally reduces capacitive noise coupling.

For example, if the clock signal is selectively applied to the clock output 130 in FIG. 3, the line (ddh0) 324 is in a dynamic evaluation state. The line (wire trace) (ddh1) 344, the line (ddh2) 364, and the line (ddh3) 384 are in a static precharge state. The line (ddh1) 344 is closest in proximity to the line (ddh0) 324, so the line (ddh0) 324 and wordline (WL<0>) 202 may be aggressors relative to the line (ddh1) 344. When a voltage on the line (ddh0) 324 is decreasing, the wordline (WL<0>) 202 is rising. The rising voltage at the wordline 202 is cross-coupled with the line (ddh1) 344, helping to offset or cancel coupling between the line (ddh1) 344 and the line (ddh0). The lines (ddh1, ddh2, and ddh3) 344, 364, and 384 are statically held by the transistors (Mp1, Mp2, and Mp3) 334, 354, and 374, respectively. The wordlines (WL<1>, WL<2>, and WL<3>) 204, 206, and 208 are statically inverted relative to the lines (ddh1, ddh2, and ddh3) 344, 364, and 384, respectively. Thus, the layout 400 contributes to the robustness of the circuit design, by reducing capacitive noise coupling between the wordline drivers 306, 308, 310, and 312.

Table 1 below illustrates a relationship between the data lines (ddh0, ddh1, ddh2, and ddh3) 324, 344, 364, and 384 that enhances capacitive noise immunity.

TABLE 1

| Dynamic nodes | Situation | Aggressor | Note: |
|---|---|---|---|
| data line (ddh0) 324 | clk<0> 130 = active; dynamic evaluation state | not applicable. | |
| data line (ddh1) 344 | clk<1> 128 = 0; static precharged state | When the data line (ddh0) 324 is falling, the wordline (WL<0>) 202 is rising. | The data line (ddh1) is statically held by the clocked p-channel transistor (Mp1) 334. The overlap of the rising wordline (WL<0>) 202 assists the data line (ddh1) 344 in resisting the capacitive coupling from (ddh0) 324 falling. |
| data line (ddh2) 364 | clk<2> 126 = 0; static precharged state | none. | The data line (ddh2) is statically held by the clocked p-channel transistor (Mp2) 354. |
| data line (ddh3) 384 | clk<3> 124 = 0; static precharged state | none. | The data line (ddh3) is statically held by the clocked p-channel transistor (Mp3) 374. |

In FIG. 4, the data line (ddh0) 324 and the wordline (WL<0>) 202 are adjacent to the data line (ddh1) 344, but are not adjacent to the other data lines (ddh2 and ddh3) 364 and 384. Thus, only the data line (ddh1) 344 may be influenced by capacitive coupling with the data line (ddh0) 324.

Table 2 below illustrates a relationship between the data lines (ddh0, ddh1, ddh2, and ddh3) 324, 344, 364, and 384 that enhances capacitive noise immunity when more than one data line is adjacent to the data line that is in a dynamic evaluation state.

TABLE 2

| Dynamic nodes | Situation | Aggressor | Note: |
|---|---|---|---|
| data line (ddh0) 324 | clk<0> 130 = 0; static precharged state | When the data line (ddh1) 344 is falling, the wordline (WL<1>) 204 is rising. | The data line (ddh0) is statically held by the clocked p-channel transistor (Mp0) 314. The overlap of the rising wordline (WL<1>) 204 assists the data line (ddh0) 324 in resisting the |

TABLE 2-continued

| Dynamic nodes | Situation | Aggressor | Note: |
|---|---|---|---|
| | | | capacitive coupling from (ddh0) 344 falling. |
| data line (ddh1) 344 | clk<1> 128 = active; dynamic evaluation state | Not applicable. | |
| data line (ddh2) 364 | clk<2> 126 = 0; static precharged state | When the data line (ddh1) 344 is falling, the wordline (WL<1>) 204 is rising. | The data line (ddh2) is statically held by the clocked p-channel transistor (Mp2) 354. The overlap of the rising wordline (WL<1>) 204 assists the data line (ddh2) 364 in resisting the capacitive coupling from (ddh1) 344 falling. |
| data line (ddh3) 384 | clk<3> 124 = 0; static precharged state | none. | The data line (ddh3) is statically held by the clocked p-channel transistor (Mp3) 374. |

In general, the data lines (ddh1 and ddh3) 344 and 384 are assisted by the output of the wordline (WL<2>) 206 and the data lines (ddh0 and ddh2) 324 and 364 are assisted by the output of the wordline (WL<1>) 204 in reducing capacitive coupling. As shown in Table 1, the output value or voltage of the wordline 202 is inverted relative to its associated data line (ddh0) 324, and the adjacent data line (ddh1) 344 experiences reduced capacitive noise coupling.

Figure 5:
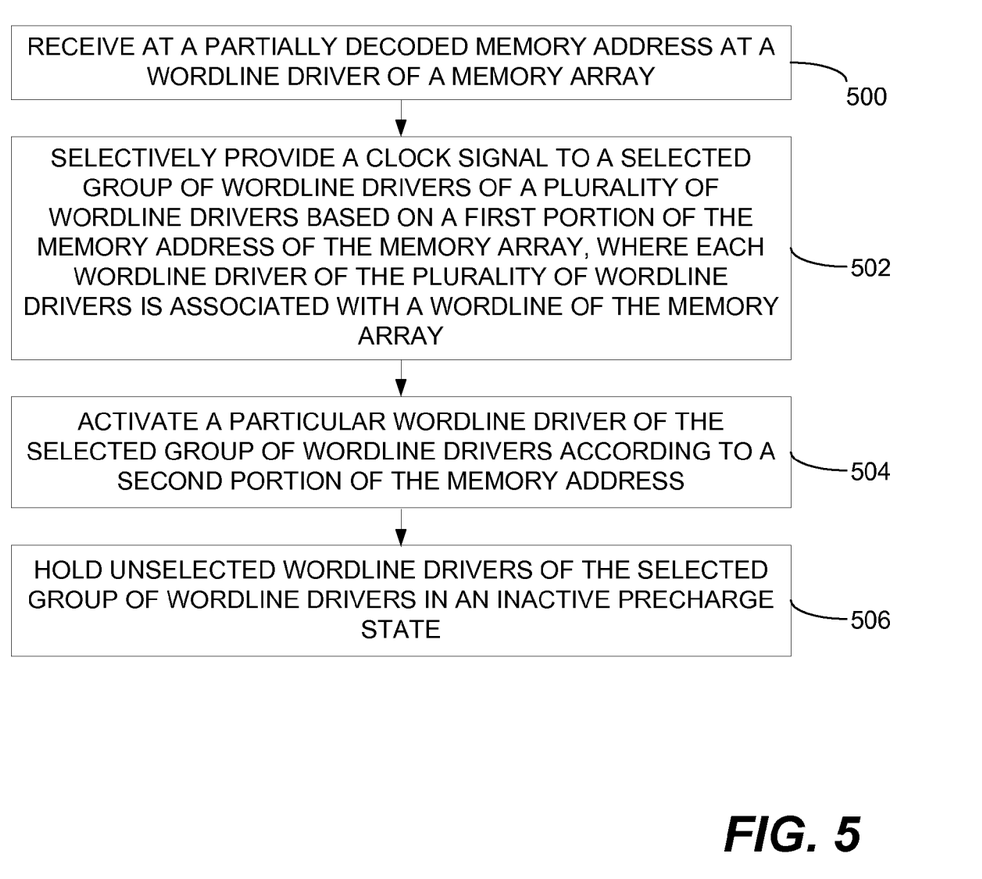
FIG. 5 is a flow diagram of a particular illustrative embodiment of a method of selectively activating a wordline of a group of wordline drivers, such as the group of wordline drivers of FIG. 4.

FIG. 5 is a flow diagram of a particular illustrative embodiment of a method of selectively activating a wordline of a group of wordline drivers, such as the group of wordline drivers of FIG. 4. A partially decoded memory address is received at a wordline driver of a memory array, at 500. A clock signal is selectively provided to a selected group of wordline drivers based on a first portion of the memory address of the memory array, where each wordline driver of the plurality of wordline drivers is associated with a wordline of the memory array, at 502. A particular wordline driver of the selected group of wordline drivers is activated according to a second portion of the memory address, at 504. Other wordline drivers of the selected group of wordline drivers are held in an inactive precharge state, at 506.

In a particular embodiment, the memory address includes six address bits. The first portion of the memory address may include two bits, and the second portion of the memory address may include the remaining four bits, for example. A two-to-four bit decoder, such as the two-to-four bit decoder 112 in FIG. 1, may decode the first portion of the address and provide the decoded first portion to a conditional clock generator, such as the conditional clock generator 110 in FIG. 1. The conditional clock generator may receive a clock input, such as the clock input 118 in FIG. 1, and may selectively apply the clock signal to a selected clock, such as one of the clocks 124, 126, 128 and 130 in FIGS. 1 and 3. The conditional clock generator may apply a zero voltage, a logic low, or ground voltage signal to the non-selected clocks.

The selected clock may activate a wordline driver, such as the wordline drivers 306, 308, 310 and 312 in FIG. 3, to provide an address input (such as the address 120 in FIG. 3) to an associated wordline (such as the wordlines 202, 204, 206, and 208 in FIGS. 2 and 3)

In a particular embodiment, a method is disclosed that may include receiving a clock signal (such as the clock input 118 in FIG. 1) and selectively applying the clock signal to one of a plurality of clocks or clock outputs (such as the clocks 124, 126, 128 and 130 in FIGS. 1 and 3) according to the decoded first portion of the memory address (e.g., according to at least two bits of the memory address using, for example, a two-to-four bit decoder, such as the two-to-four bit decoder 112 in FIG. 1). In another particular embodiment, the method may include determining a clock output (such as the clocks 124, 126, 128 and 130 in FIG. 1) according to the decoded first portion of the memory address using a conditional clock generator (such as the conditional clock generator 110 in FIG. 1). In another particular illustrative embodiment, a selected group of wordline drivers (such as the wordline drivers 306, 308, 310 and 312) includes a shared address input (e.g. the address input 120 or the address input 122 in FIG. 1 or the address input 304 in FIG. 3) to receive the second portion of the memory address.

The various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The previous description of the disclosed embodiments is provided to enable any person skilled in the art to make or use the present disclosure. Various modifications to such disclosed embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features as defined by the following claims.

What is claimed is:

1. A circuit device comprising:
   first logic to receive a clock signal and a first portion of a memory address of a memory array, the first logic to decode the first portion of the memory address and to apply the clock signal to a selected clock output of a plurality of clock outputs associated with a selected group of a plurality of wordline drivers that are associated with the memory array; and second logic to decode a second portion of the memory address, the second logic to selectively activate a particular wordline driver of the selected group of wordline drivers according to the second portion of the memory address.

2. The circuit device of claim 1, wherein the first logic comprises a conditional clock generator to receive the clock signal and to selectively apply the clock signal to the selected clock output.

3. The circuit device of claim 2, wherein the conditional clock generator selectively applies the clock signal to the selected clock output according to the first portion of the memory address.

4. The circuit device of claim 1, wherein the first logic comprises a decoder to decode at least two address bits to determine the first portion of the memory address.

5. The circuit device of claim 1, wherein the first logic generates four conditional clock outputs, wherein one of the four conditional clock outputs is active at a time, the first logic to apply the one conditional clock output as the selected clock output.

6. The circuit device of claim 1, wherein the selected group of wordline drivers comprises four wordline drivers, each of the four wordline drivers is associated with a respective wordline of the memory array, wherein the four wordline drivers share a common address input.

7. A method of selecting a particular wordline of a memory array, the method comprising:
decoding a first portion of a memory address of the memory array;
selectively providing a clock signal to a selected group of a plurality of wordline drivers based on the first portion of the memory address, wherein each of the plurality of wordline drivers is associated with a wordline of the memory array;
decoding a second portion of the memory address; and
activating a particular wordline driver of the selected group of wordline drivers according to the second portion of the memory address.

8. The method of claim 7, further comprising:
receiving the clock signal;
selectively applying the clock signal to one of a plurality of clock outputs according to the first portion of the memory address.

9. The method of claim 7, further comprising:
determining a clock output according to the first portion of the memory address using a conditional clock generator.

10. The method of claim 7, wherein each wordline driver in the selected group of wordline drivers has a shared address input to receive the second portion of the memory address.

11. A circuit device comprising:
means for decoding a first portion of a memory address of a memory array;
means for selectively providing a clock signal to a selected group of wordline drivers based on the first portion of the memory address;
means for decoding a second portion of the memory address; and
means for activating a particular wordline driver of the selected group of wordline drivers according to the second portion of the memory address.

12. The circuit device of claim 11, wherein each of the wordline drivers is associated with a wordline of the memory array.

13. The circuit device of claim 12, further comprising:
a conditional clock generator including an address input to receive the first portion of the memory address and a clock input to receive a clock signal, the conditional clock generator to selectively apply the clock signal to one of a plurality of clock outputs according to the first portion of the memory address.

14. The circuit device of claim 12, wherein the means for decoding a second portion of the memory address further comprises means for appling the second portion of the memory address to a shared address line.

15. The circuit device of claim 12, wherein the circuit device comprises an integrated circuit.

16. The circuit device of claim 15, wherein the integrated circuit includes the memory array.

17. A circuit device comprising:
an address input;
a plurality of clock outputs;
a group of wordline drivers coupled to a wordline of a memory array, each wordline driver of the group of wordline drivers coupled to the address input and coupled to a respective clock output of the plurality of clock outputs; and
logic comprising:
first logic to receive a clock signal and a first portion of a memory address of the memory array, the first logic to decode the first portion of the memory address and to apply the clock signal to a selected clock output of the plurality of clock outputs; and
second logic to decode a second portion of the memory address, the second logic to selectively activate a particular wordline driver of the group of wordline drivers according to the second portion of the memory address.

18. The circuit device of claim 17, wherein the selected wordline driver of the group of wordline drivers is in an active evaluation state wherein other wordline drivers of the group of wordline drivers are in a static precharge state.

19. The circuit device of claim 18, wherein a state of the wordline driver is determined by the selective application of the clock signal.

20. The circuit device of claim 17, wherein the logic comprises a conditional clock generator.

21. A circuit device comprising:
first logic to receive a clock signal and a first portion of a memory address of a memory array, the first logic to decode the first portion of the memory address and to apply the clock signal to a selected clock output of a plurality of clock outputs associated with a selected group of a plurality of wordline drivers that are associated with the memory array, wherein the first logic comprises a conditional clock generator to receive the clock signal and to selectively apply the clock signal to the selected clock output; and
second logic to decode a second portion of the memory address, the second logic to selectively activate a particular wordline driver of the selected group of wordline drivers according to the second portion of the memory address.

22. The circuit device of claim 21, wherein the conditional clock generator selectively applies the clock signal to the selected clock output according to the first portion of the memory address.

23. A circuit device comprising:
first logic to receive a clock signal and a first portion of a memory address of a memory array, the first logic to decode the first portion of the memory address and to apply the clock signal to a selected clock output of a plurality of clock outputs associated with a selected group of a plurality of wordline drivers that are associated with the memory array, wherein the first logic comprises a decoder to decode at least two address bits to determine the first portion of the memory address; and
second logic to decode a second portion of the memory address, the second logic to selectively activate a particular wordline driver of the selected group of wordline drivers according to the second portion of the memory address.

24. A circuit device comprising:
first logic to receive a clock signal and a first portion of a memory address of a memory array, the first logic to decode the first portion of the memory address and to apply the clock signal to a selected clock output of a plurality of clock outputs associated with a selected group of a plurality of wordline drivers that are associated with the memory array, wherein the first logic generates four conditional clock outputs, wherein one of the four conditional clock outputs is active at a time, the first logic to apply the one conditional clock output as the selected clock output; and
second logic to decode a second portion of the memory address, the second logic to selectively activate a particular wordline driver of the selected group of wordline drivers according to the second portion of the memory address.

25. A circuit device comprising:
first logic to receive a clock signal and a first portion of a memory address of a memory array, the first logic to decode the first portion of the memory address and to apply the clock signal to a selected clock output of a plurality of clock outputs associated with a selected group of a plurality of wordline drivers that are associated with the memory array, wherein the selected group of wordline drivers comprises four wordline drivers, each of the four wordline drivers is associated with a respective wordline of the memory array, wherein the four wordline drivers share a common address input; and
second logic to decode a second portion of the memory address, the second logic to selectively activate a particular wordline driver of the selected group of wordline drivers according to the second portion of the memory address.

26. A method of selecting a particular wordline of a memory array, the method comprising:
selectively providing a clock signal to a selected group of a plurality of wordline drivers based on a first portion of a memory address of the memory array, wherein each of the plurality of wordline drivers is associated with a wordline of the memory array, wherein each wordline driver in the selected group of wordline drivers has a shared address input to receive the second portion of the memory address; and
activating a particular wordline driver of the selected group of wordline drivers according to a second portion of the memory address.

27. A circuit device comprising:
means for selectively providing a clock signal to a selected group of wordline drivers based on a first portion of a memory address of a memory array, wherein each of the wordline drivers is associated with a wordline of the memory array;
a conditional clock generator including an address input to receive the first portion of the memory address and a clock input to receive the clock signal, the conditional clock generator to selectively apply the clock signal to one of a plurality of clock outputs according to the first portion of the memory address; and
means for activating a particular wordline driver of the selected group of wordline drivers according to a second portion of the memory address.

28. The circuit device of claim 27, further comprising a decoder to decode the memory address to determine the second portion of the memory address and to apply the second portion of the memory address to a shared address line.

29. A circuit device comprising:
an address input;
a plurality of clock outputs;
a group of wordline drivers coupled to a wordline of a memory array, each wordline driver of the group of wordline drivers coupled to the address input and coupled to a respective clock output of the plurality of clock outputs, wherein the selected wordline driver of the group of wordline drivers is in an active evaluation state and wherein other wordline drivers of the group of wordline drivers are in a static precharge state; and
logic comprising:
first logic to receive a clock signal and a first portion of a memory address of the memory array, the first logic to decode the first portion of the memory address and to apply the clock signal to a selected clock output of the plurality of clock outputs; and
second logic to decode a second portion of the memory address, the second logic to select a particular wordline driver of the group of wordline drivers according to the second portion of the memory address and to selectively apply a clock signal to one of the plurality of clock outputs to activate the selected wordline driver.

30. The circuit device of claim 29, wherein a state of the one wordline driver is determined by the selective application of the clock signal.

31. The circuit device of claim 1, wherein the first logic comprises a conditional clock generator to receive the clock signal and to selectively apply the clock signal to the selected clock output, and wherein the first logic is further to generate multiple conditional clock outputs, wherein one of the multiple conditional clock outputs is an active conditional clock output, the first logic to apply the active conditional clock output as the selected clock output.

32. The circuit device of claim 2, wherein the conditional clock generator selectively applies the clock signal to the selected clock according to one of the first portion and the second portion of the memory address.

33. The circuit device of claim 1, wherein the first logic generates a plurality of conditional clock outputs, wherein one of the plurality of conditional clock outputs is active at a time, the first logic to apply the active conditional clock output as the selected clock output.

34. The circuit device of claim 1, wherein the selected group of wordline drivers comprises four wordline drivers, each of the four wordline drivers associated with a respective wordline of the memory array, wherein the four wordline drivers share a common address input, and wherein the first logic is further to generate four conditional clock outputs, wherein one of the four conditional clock outputs is an active conditional clock output, the first logic to apply the active conditional clock output as the selected clock output.

35. The method of claim 1, wherein each wordline driver in the selected group of wordline drivers has a shared address input to receive the second portion of the memory address.

36. The circuit device of claim 11, wherein each of the wordline drivers is associated with a corresponding wordline of the memory array.

37. The circuit device of claim 17, wherein the selected wordline driver of the group of wordline drivers is in an active evaluation state, wherein other wordline drivers of the group of wordline drivers are in a static precharge state, and wherein the logic comprises a conditional clock generator.

38. The circuit device of claim 17, wheren the second logic selects the particular wordline driver of the group of wordline drivers according to the second portion of the memory address and selectively applies a clock signal to one of the plurality of clock outputs to selectively activate the particular wordline.

* * * * *

UNITED STATES PATENT AND TRADEMARK OFFICE
CERTIFICATE OF CORRECTION

| | | |
|---|---|---|
| PATENT NO. | : 7,693,002 B2 | Page 1 of 1 |
| APPLICATION NO. | : 11/548132 | |
| DATED | : April 6, 2010 | |
| INVENTOR(S) | : Lin | |

It is certified that error appears in the above-identified patent and that said Letters Patent is hereby corrected as shown below:

Column 12, line 13, claim 14: "appling" to read as --applying--

Column 13, line 59, claim 26: "the second portion" to read as --a second portion--

Column 13, line 62, claim 26: "a second portion" to read as --the second portion--

Column 14, line 24, claim 29: "the selected wordline driver" to read as --a selected wordline driver--

Column 16, line 4, claim 38: "wheren" to read as --wherein--

Column 16, line 7, claim 38: "a clock signal" to read as --the clock signal--

Signed and Sealed this
Fifth Day of July, 2011

David J. Kappos
*Director of the United States Patent and Trademark Office*